United States Patent [19]

Dube et al.

[11] Patent Number: 5,039,182
[45] Date of Patent: Aug. 13, 1991

[54] STORING INFORMATION IN DUAL HOLOGRAPHIC IMAGES

[75] Inventors: Roger R. Dube, Carmel, N.Y.; Uri Sarid, Cambridge, Mass.

[73] Assignee: International Business Machines Corporation, Armonk, N.Y.

[21] Appl. No.: 425,078

[22] Filed: Oct. 23, 1989

[51] Int. Cl.⁵ .................. G02H 1/02; G03H 1/10; G02B 27/00
[52] U.S. Cl. .................. 359/3.67; 350/3.67; 350/3.77; 350/320
[58] Field of Search ............... 350/320, 321, 3.6–3.86; 356/347–360

[56] References Cited

U.S. PATENT DOCUMENTS

| | | | |
|---|---|---|---|
| 3,544,189 | 12/1970 | Chen et al. | 350/3.5 |
| 3,620,589 | 11/1971 | Dudderar et al. | 350/3.83 |
| 3,622,220 | 11/1971 | Kogelnik | 350/3.5 |
| 3,698,789 | 10/1972 | Wolber | 350/6.1 |
| 3,825,316 | 7/1974 | Amodei | 350/3.5 |
| 3,834,787 | 9/1974 | Oshida | 250/3.75 |
| 3,891,976 | 6/1975 | Carlsen | 350/3.75 |
| 3,915,549 | 10/1975 | Amodei et al. | 350/3.64 |
| 4,138,189 | 2/1979 | Huignard et al. | 350/3.64 |
| 4,449,785 | 5/1984 | Huignard et al. | 350/3.61 |
| 4,478,481 | 10/1984 | Fusek et al. | 350/3.6 |
| 4,655,542 | 4/1987 | Dube | 350/3.64 |
| 4,720,158 | 1/1988 | Kowayawa et al. | 350/3.75 |
| 4,739,496 | 4/1988 | Marom et al. | 350/3.6 |
| 4,807,970 | 2/1989 | Dube et al. | 350/320 |
| 4,830,444 | 5/1989 | Cloonan et al. | 350/3.73 |

OTHER PUBLICATIONS

L. d'Auria et al. "Experimental Holographic Read-Write Memory Using 3-D Storage", Applied Optics vol. 13, No. 4, Apr. 1974, pp. 808-818.

Primary Examiner—Bruce Y. Arnold
Assistant Examiner—Thong Nguyen
Attorney, Agent, or Firm—H. F. Somermeyer

[57] ABSTRACT

A holographic storage system receives light having its linear polarization rotated from a reference linear polarization for carrying given information. The modulated light is stored as two distinct images in a photorefractive crystal, the images carrying the same information but being complementary projections of linear polarization rotations from the reference linear polarization in a given rotational sense. The images are stored in the same volume portion of the crystal. Upon readout, the two images are converted into modulated electrical signals. To reproduce the information, one of the modulated electrical signals is divided into the other modulated electrical signal. A function of square root of arc tangent is introduced into the signal processing at the output portion of the system.

3 Claims, 1 Drawing Sheet

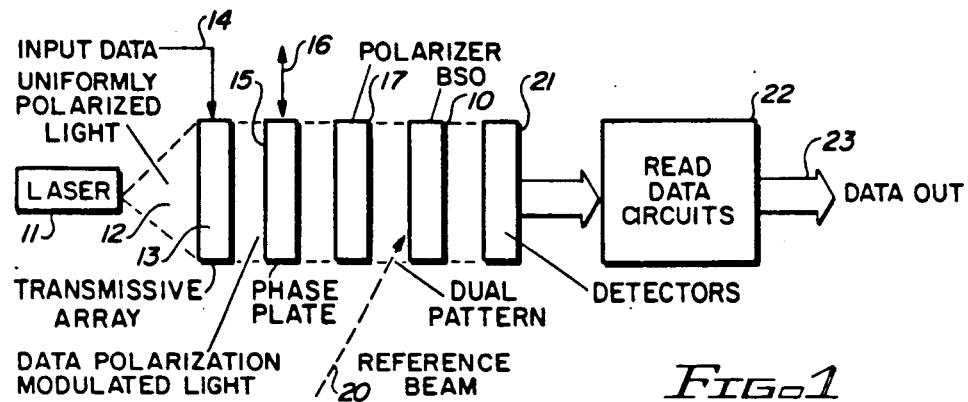
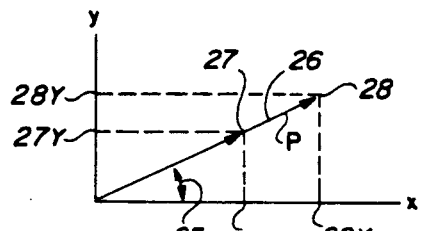
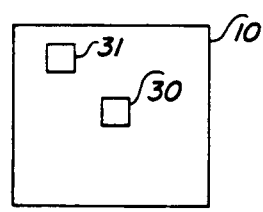
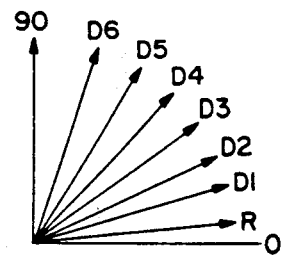
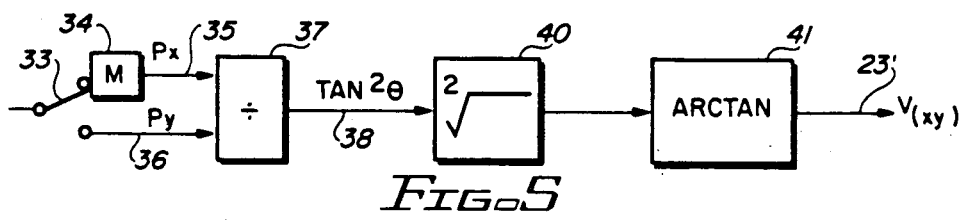

STORING INFORMATION IN DUAL HOLOGRAPHIC IMAGES

BACKGROUND OF THE INVENTION

1. Field of the Invention

The present invention relates to information signal storage, more particularly to information storage in photorefractive crystals.

2. Discussion of Prior Art

It is well known that light impinging upon photorefractive crystals serving as a record-medium such as bismuth silicon oxide (BSO), when activated by a reference beam, causes interference of the two monochromatic light beams within the crystal. The light interference results in storage of data carried by the light beams as a volume hologram in a portion of the record medium. Readout of the stored hologram is achieved by shining a reference light beam into the record medium for causing the reference beam to be modulated by the stored hologram as it passes through the record medium. The modulated reference beam leaves the record medium along an output light path. It is known to superpose holograms in a thick photorefractive medium, such as BSO.

The L. d'Auria et al. report in the periodical APPLIED OPTICS in an article entitled "Experimental Holographic Read-Write Memory Using 3-D Storage", Vol. 13 No. 4, April 1974, in pages 808–818 advises that holograms can be superposed in a photorefractive record medium by rotating the reference beam. The rotation of the reference beam causes it to have different angles of incidence on the input surface of the thick recording medium. Because of different angles of incidence, the modulated light beam carrying the information to be stored creates a plurality of holograms superposed in the same volume. Each of the holograms are readable by a readout reference beam aligned at the angle used for recording the respective superposed holograms. Such recording has required that the intensity of the pixels in the hologram be modulated to carry information. The intensity modulated pixels are subject to noise generated by the optical path through which the pixels travel.

It is also well known that a laser monochromatic light beam in addition to carrying information based upon light intensity modulation, can carry information at different angles of rotation of the linear polarization of the light beam with respect to a reference linear light polarization. Such polarization rotation results in P and S components, which are orthogonally disposed in the light beam. An example of such modulation is the readback light beam reflected from or transmitted through a magneto optic record medium. The readback optics and electrical circuits for a magnetooptic record medium process the P and S components of the modulated reflected light beam for generating modulated output electrical signals. The rotational modulation of light polarization carry information in its P and S components. Many optical systems process light beams through polarization sensitive beam splitters and other elements. An example of such light beam processing is shown in U.S. Pat. Nos. 3,544,189 and 3,622,220. Accordingly, it is well known to separate the P and S components and to rotate the linear polarization of light beams for achieving various optical separation functions.

U.S. Pat. No. 3,825,316 discloses a holographic system in which the polarization of the light is switched in either of two directions for detection. According to this patent, a laser produces a beam of polarized coherent light which is transmitted through a polarization switching device that adjusts, in response to an input signal, the orientation of the plane of polarization of the transmitted light in either one of two mutually orthogonal states. The light transmitted by the polarization switching device then impinges on a transparent electro-optic crystal material whose index of refraction along its C axis varies in accordance with the interference fringes of a pre-established holographic pattern. In one embodiment disclosed in this patent, the optical system includes an electro-optic beam deflector to provide a strong-polarization-dependent digital laser beam deflection system such that the beam is deflected in a different predetermined direction depending upon the polarization state of the beam, i.e. beam splitting. In another embodiment shown in this patent, the optical system includes a complex optical component to provide light deflection apparatus for selectively deflecting a beam of light from a source to one of a plurality of target positions.

All of the above references, with regard to holograms, show an intensity modulated beam for carrying information; it is also known that a single light beam carries information by rotational modulation of the linear light polarization. It is desired to provide a more efficient and noise free holographic signal storage system wherein the information is carried by rotational modulation of linear polarization of laser light beams.

SUMMARY OF THE INVENTION

It is an object of the invention to provide an optical information storage system having enhanced signal-to-noise ratios.

Method and apparatus of the invention provide for storing in a holographic medium, preferably as a volume hologram, information represented by any one of a plurality of angles of linear polarization rotations having two or more discrete angles of rotation from a reference linear polarization. All of the polarization rotations are measured in the same rotational sense, i.e., in the same direction of rotation.

Also, in accordance with the present invention, a light beam carrying information in the form of a plurality of angular rotational modulations of the linear polarization of a light beam is stored as a plurality of images in a photorefractive crystal. The storage of the images is arranged to be complementary such that imperfections in the crystal are obviated by the complementary storage. In a specific form, the modulated light beams are stored as two different images having respective angular modulations separated by ninety degrees, i.e., orthogonal as measured in a first or rotational sense or rotational direction from a reference linear polarization.

In the storage and readback of the two complementary images, signal processing within the storage system introduces the control of the polarization rotation such that this rotation represents an input signals. The output signal of the two images are then divided, one into another to produce a single-modulated electrical output signal. The output signal has a polarization rotated modulation that is a faithful reproduction of the input modulation of a light beam. More than two images may be generated with the divisional function being applied between various pairs of the output signals.

The foregoing and other objects, features, and advantages of the invention will be apparent from the following more particular description of preferred embodiments of the invention, as illustrated in the accompanying drawings.

DESCRIPTION OF THE DRAWING

FIG. 1 diagrammatically illustrates apparatus incorporating the teachings of the present invention.

FIG. 2 illustrates operation of the FIG. 1-illustrated apparatus with respect to the effect of unintended intensity modulations of light beams being processed and stored.

FIG. 3 is a diagrammatic plan view of a holographic storage medium having reference and data pixel positions.

FIG. 4 diagrammatically illustrates linear polarization rotations for storing information in six discrete angular rotations from a reference linear polarization which exemplifies one operation of the FIG. 1-illustrated apparatus.

FIG. 5 is a simplified block diagram of read data circuits of the FIG. 1 illustrated apparatus.

DETAILED DESCRIPTION OF THE ILLUSTRATIVE EMBODIMENTS

Referring now more particularly to the drawing, like numerals indicate like parts and structural features in the various figures. A BSO photorefractive record medium 10 is capable of storing volume holograms in superposed relationships, that is, a plurality of holograms are stored in a same volume portion of the BSO crystal 10. In accordance with the invention, by storing complementary images derived from the same information, the noise inducing parameters of the crystal as well as non-uniformities in the optical path and laser beam can be accommodated.

A laser 11 supplies a linearly polarized monochromatic light beam along a path 12 for flooding an input surface of an LCD (liquid crystal device) transmissive array. Input data supplied along line 14 controls the transmissive array 13 for modulating the laser 11 emitted linearly polarized light. The arrangement is such that at each pixel position in the array, the uniformly polarized light has its linear polarization rotated in a first rotational sense or rotatable direction through an angle representative of the input data. One of the pixels in the array may be designated as a reference pixel, i.e. is not modulated for providing a relative angular measurement between all of the data carrying pixels with the reference pixel. The light transmitted through array 13 is selectively passed through a one-half wave plate, also termed a phase plate. The phase plate 15, when in the light path, rotates the linear polarization 90 degrees. When phase plate 15 is in the light path between the transmissive array 13 and the BSO 10 input surface, all of the linear polarization modulations in light beam 12 are further rotated in a first rotational sense ninety degrees. When phase plate 15 is removed from the light path, as indicated by double headed arrow 16, then no rotation of the linear polarizations in light beam 12 occurs. The selective phase plate 15 causes rotation of the linear polarizations of light beam 12 creates two complementary holographic images stored in BSO crystal 10; one of the holographic images is not complementarily rotated and a second one of the holographic images is stored with its linear polarizations rotated 90 degrees rotated by phase plate 15. For speeding the operation of the mechanical movement of the phase plate 15, a plurality of phase plates 15 may be inerted onto a rapidly rotating circular disk (not shown), much like a tachometer disk, such that alternate areas on the disk rotate the light beam polarization by ninety degrees with the intermediate areas not rotating the light beam. That is, the rotating disk (not shown) has a plurality of circumferentially spaced-apart phase plates with the intermediate areas between the spaced-apart phase plate 15. As the disk rotates, successive light beams are transmitted through the disk alternately between 90 degrees polarization rotation by a phase plate 15 and no polarization rotation through areas intermediate of such phase plates. Other arrangements, including electrically actuated rotations may be readily visualized for achieving the construction of two complementary holograms. From the phase plate position represented by phase plate 15 in FIG. 1, either with the phase plate 15 in the light path or out of the light path, the modulated light passes through polarizer 17, then impinges upon the input surface of BSO record medium or crystal 10. A reference beam 20 is supplied to the input surface of the BSO crystal 10 to record or store each received modulated light beam as a volume hologram. In a preferred form, the non-phase plate rotated beam (phase plate 15 is not in the light path) is first recorded in the BSO crystal, then the phase plate 15 moves into optical interceptive relationship to the laser beam for rotating the laser beam to create a complementary volume hologram in the BSO crystal 10. Note that for this complementary hologram, the reference beam 20 is rotated to impinge on the BSO crystal 10 at an orthogonal angle of polarization relative to that at which the first hologram was recorded. To obtain a plurality of pairs of volume holograms, reference beam 20 may be rotated such that different angles of incidence on the input surface of BSO crystal 10 are achieved.

To read out the stored or recorded volume holograms, reference beam 20 shines upon the input surface of BSO crystal 10 without any input from laser 11. To sequentially read the two holograms, the linear polarization of the reference beam is not rotated. The reference beam is positioned at an angle to read the first hologram. The first hologram modulates the reference beam to supply an output set of laser beams (these beams are a reconstructed image of the stored information) which impinge upon an array of detectors 21. The second (complementary) hologram was stored at an orthogonal polarization to the first hologram. To read the second hologram, the reference beam is rotated to the orthogonal polarization; the read out (reconstruction) proceeds as described for the first hologram. The two reconstructed images are sequentially supplied to detectors 21 and therefrom are sequentially supplied to read data circuits 22. As later described, read data circuits 22 supply an output signal through cable 23 by combining the two images through a divisional processing for reconstructing the information carried by the modulation imposed upon the light beam in transmissive array 13.

FIG. 2 illustrates an advantage of the present invention. A first angle of rotation represented by the arrow 26 represents the encoding of input data. The arrow is shown to have two lengths 27, 28 which respectively represent two unintended intensity levels of the laser beam. In the recording scheme central to this invention, this information is stored as two complementary images. The first image, without the phase plate, stores an image whose intensity is determined by the length of the component 27X or 28X of the arrow 26 two image intensities. Following the recording sequence described earlier, a phase plate is inserted into the beam, the reference angle is rotated to the orthogonal polarization and a second image is recorded. The function of the phase plate is to rotate the arrows (representing the polarization) by 90 degrees, so that the second image stored now records projections 27Y and 28Y, respectively, for the two intentities of the laser beam. Upon readout, the ratio stored Y component over stored X component is the tangent of the angle 25 enabling the angle 25 to be determined. If this process were to occur under different intensity conditions as represented by numerals 27 and 28, there is no noise effect on the information retrieval. In this manner, the described storage process provides insensitivity to unintended variations in light intensity.

FIG. 3 illustrates, in diagrammatic form, a polarization rotation reference system for faithfully indicating the recorded information. A centrally located pixel 30 is unmodulated and therefore represents the reference polarization location for all of the pixels in the array being stored. Each data carrying pixel, such as pixel 31 (there are many such data carrying pixels), is modulated in accordance with the input data on line 14. From FIG. 3 it is apparent that if an optical element causes an unintended rotation of the linear polarization of the multipixel light beam, then such unintended linear polarization rotation will be substantially constant through out the beam and hence, can be accommodated through the use of a reference pixel 30.

FIG. 4 illustrates angular representation of information at a single pixel. Shown are six different angles of rotation all being in a counterclockwise rotational since from a reference angle of rotation R. The various rotated vectors, D1–D6, represent the six angular positions. Such six angular positions of rotated linear polarizations can be encoded to represent six different bits, can be a number to the base six, or can be a encoded number in binary form to the sixth power. The length of the arrows represents the vector intensity which, of course, is projected by the polarizer onto one of the two coordinate axes. The angular rotations can extend from zero up to and including 90 degrees.

FIG. 5 shows an early embodiment of data read circuits 22 for detecting the information carried on input data line 14 from the volume hologram stored in record medium 10. This figure illustrates a so-called post processing arrangement for introducing the arc tangent of square root parameter into the signal detection processing. Electrical signals from detectors 21 are in array form. FIG. 5 illustrates only one circuit for one pixel. A signal from a detector 21 is supplied through an electronic switch 33. The first image reconstructed by the reference beam 20 is supplied to a memory M 34. Switch 33 then moves to the alternate terminal for enabling processing the second or complementary signal. When the second image is reconstructed by reference beam 20, circuits (not shown) actuate the switch 33 in synchronism with the transmission of the electrical signal from the same detector 21 such that the signals on lines 35 and 36, respectively, represent electrical signals derived from the first and second (complementary image) pixels of BSO 10. Divide circuit 37, which may be either analog or digital, divides the signal Px, the first recorded signal with no complementary rotation, by the second signal Py which represents the stored signal rotated by ninety degrees through phase plate 15. The output signal of divide circuit 37 on line 38 carries electrically modulated signal representative of $TAN^2 \theta$. Circuit elements 40 and 41 introduce the arc tangent of square root into the read back signal for producing a signal on line 23', which is a true reproduction of the input modulation carried by input data on line 14. Final reproduction of the data is provided by a lookup table (not shown) storing values representing the above-described function. Circuit 40 is a typical square root circuit, while circuit 41 is a typical arctan circuit.

Explaining the operation of FIG. 1, the projection of the polarization vectors, or their squares, along two noncolinear axes, typically orthogonally disposed axes, results in a two separated holograms. If the intensity of the image before the polarizer 17 is indicated by I(x,y) and the polarization angle by $\theta$ (x,y) then the stored patterns within BSO crystal 10 are given by:

$$Px\ (x,y) = I(x,y)\ COS^2\ \theta\ (x,y) \quad (1)$$

$$Py\ (x,y) = I(x,y)\ SIN^2\ \theta\ (x,y) \quad (2)$$

In the above equations (1) and (2), the letter "P" indicates the stored pattern or hologram. Note that the signal is embodied in $\theta$ (x,y) not in I (x,y) which in general suffers from non-uniformities in the laser, the optical path, and the crystal. Upon readout, information further unintended intensity nonuniformities may be produced. Thus the patterns read out may be of the form in equations (3) and (4).

$$Px'\ (x,y) = I'(x,y)\ COS^2\ \theta\ (x,y) \quad (3)$$

$$Py'\ (x,y) = I'(x,y)\ SIN^2\ \theta\ (x,y) \quad (4)$$

To recover the original information, the two images are divided into each other on a pixel-by-pixel basis yielding an intermediate result, as represented by the signal on line 38. This output signal is independent of any noise in I' (x,y) induced into the reconstructed patterns. The post processing shown in FIG. 5 of the square root and arctangent yields a modulated electrical signal carrying the information.

While the invention has been particularly shown and described with reference to its preferred embodiments thereof, it will be understood by those skilled in the art that various changes in form and details may be made therein without departing from the spirit and scope of the invention.

What is claimed is:

1. A method of storing information in a photorefractive crystal record medium, including the steps of:
   constructing an array of pixel light beams using a substantially monochromatic light such that each of the pixel light beams have a rotatable linear polarization, establishing a single reference angle of linear polarization rotation in each of the pixel light beams;
   rotating the linear polarizations of the respective pixel light beams from said reference angles of linear polarization rotation, respectively, for carrying information represented by said rotated linear polarizations for creating an array of modulated pixel light beams;
   shining a reference light beam into the photorefractive crystal record medium;

directing the array of modulated pixel light beams into the photorefractive crystal record medium for optically interfering with the reference beam in order to create and record a resultant interference pattern as a holographic image in the photorefractive crystal record medium wherein said modulated pixel light beams create pixel positions in said holographic image and record the carried information as a pixel interference pattern in the pixel positions, respectively; and after recording said interference pattern, rotating all said linearly polarized light in the respective pixel light beams 90 degrees in a same rotational direction to form a complementary array of modulated pixel light beams including maintaining the direction of the array to the record medium such that the complementary modulated pixel light beams enter the record medium where the first mentioned modulated pixel light beams entered the photorefractive crystal record medium; and then repeating said shining and directing steps for the complementary array of modulated pixel light beams whereby two holographic images containing the same information are recorded in the photorefractive crystal record medium.

2. The method set forth in claim 1, further including the step of:

in said step for rotating the linear polarizations, selectively and independently rotating the linear polarization of said pixel light beams respectively by more than one angle of linear polarization rotation such that a plurality of signal states greater than or equal to two are recorded in each pixel position of the holographic image.

3. The method of storing information in a holographic photorefractive record medium wherein the information to be stored is carried in a plurality of light beams, each of the light beams having linearly polarized light, the light polarizations being rotationally displaced within the respective light beam from a reference polarization rotational position in the respective light beam by respective predetermined angles, comprising the steps of:

during first and second successive time periods, shining a reference light beam into a first volume portion of the record medium;

during said first time period, shining a first light beam into the first volume portion of said record medium, said first light beam carrying said predetermined information by said light polarization in the first light beam being rotationally displaced at a first one of said predetermined angles from said reference polarization rotational position of said first light beam and such that the first light beam and the reference light beam are in optical interference in said first volume portion thereby creating a first volume hologram in the first volume portion and recording the created volume hologram as a first holographic image in the first volume portion of the record medium; and during said second time period, shining a second light beam into the first volume portion of said record medium, said second light beam carrying said predetermined information by said linear polarization of light in the second beam being rotationally displaced from the reference rotational position of the second light beam a second one of said predetermined angles such that the linear polarizations of the light in the first and second light beams are perpendicular as the respective light beams enter said first volume portion, said second light beam being in optical interference with the reference light beam in said first volume portion of the record medium for creating and recording a second volume hologram in the first volume portion as a second holographic image.

* * * * *